(12) United States Patent
Chang et al.

(10) Patent No.: US 11,127,669 B2
(45) Date of Patent: Sep. 21, 2021

(54) FLEXIBLE DISPLAY SCREEN AND FLEXIBLE DEVICE

(71) Applicant: SHENZHEN ROYOLE TECHNOLOGIES CO., LTD., Guangdong (CN)

(72) Inventors: Tsu Chiang Chang, Guangdong (CN); Chang Ming Chiu, Guangdong (CN); Yuning Wang, Guangdong (CN)

(73) Assignee: SHENZHEN ROYOLE TECHNOLOGIES CO., Shenzhen (CN)

( * ) Notice: Subject to any disclaimer, the term of this patent is extended or adjusted under 35 U.S.C. 154(b) by 0 days.

(21) Appl. No.: 16/914,838

(22) Filed: Jun. 29, 2020

(65) Prior Publication Data
US 2020/0328145 A1     Oct. 15, 2020

Related U.S. Application Data

(63) Continuation of application No. PCT/CN2017/119875, filed on Dec. 29, 2017.

(51) Int. Cl.
  *H01L 23/498*     (2006.01)

(52) U.S. Cl.
  CPC .... *H01L 23/49838* (2013.01); *H01L 23/4985* (2013.01)

(58) Field of Classification Search
  CPC ........... H01L 23/49838; H01L 23/4985; G06F 1/1652

(Continued)

(56) References Cited

U.S. PATENT DOCUMENTS

| 2014/0055702 A1 | 2/2014 | Bae et al. |
| 2014/0217373 A1* | 8/2014 | Youn .................. H01L 23/4985 257/40 |

(Continued)

FOREIGN PATENT DOCUMENTS

| CN | 106373923 A | 2/2017 |
| CN | 106486491 A | 3/2017 |

(Continued)

OTHER PUBLICATIONS

International Search Report issued in corresponding International Application No. PCT/CN2017/119875, dated Sep. 21, 2018, pp. 1-6, State Intellectual Property Office of the P.R. China, Beijing, China.

(Continued)

*Primary Examiner* — Sherman Ng
(74) *Attorney, Agent, or Firm* — Hauptman Ham, LLP

(57) ABSTRACT

A flexible display screen and a flexible device are provided by the present application. The flexible display screen includes a bending area. The bending area includes at least one wiring layer. The at least one wiring layer includes a plurality of conducting wires arranged at intervals. Each of the plurality of conducting wires includes at least two current paths. The at least two current paths are configured to transmit an identical current signal passing through corresponding conducting wire. Since each of the plurality of conducting wires has at least two current paths, the plurality of conducting wires can continue to provide an electrical current when the plurality of conducting wires are damaged during bending. Therefore, the flexible display screen has strong stability and long service life.

18 Claims, 6 Drawing Sheets

(58) Field of Classification Search
USPC .......................................................... 361/749
See application file for complete search history.

(56) References Cited

U.S. PATENT DOCUMENTS

| | | | |
|---|---|---|---|
| 2016/0035759 A1 | 2/2016 | Kwon et al. | |
| 2017/0287394 A1* | 10/2017 | Kim | G09G 3/3266 |
| 2017/0317299 A1 | 11/2017 | Choi et al. | |

FOREIGN PATENT DOCUMENTS

| | | |
|---|---|---|
| CN | 106716642 A | 5/2017 |
| CN | 106952937 A | 7/2017 |
| CN | 107393931 A | 11/2017 |
| CN | 107482036 A | 12/2017 |
| KR | 20170054436 | 5/2017 |
| WO | 2016057231 A1 | 4/2016 |

OTHER PUBLICATIONS

The Extended European Search Report issued in corresponding EP Application No. EP 17935929.4 dated Jun. 24, 2021, pp. 1-9, European Patent Office, Munich, Germany.
The First Office Action issued in corresponding KR Application No. KR2020-7021721 dated Jul. 30, 2021.

\* cited by examiner

FLEXIBLE DISPLAY SCREEN AND FLEXIBLE DEVICE

CROSS-REFERENCE TO RELATED APPLICATION

This application is a continuation of PCT/CN2017/119875, filed on Dec. 29, 2017, the disclosure of which is hereby incorporated by reference in its entirety.

TECHNICAL FIELD

The present disclosure relates to a technical field of flexible display, more particularly to a flexible display screen and a flexible device.

BACKGROUND

Since flexible display screens have many advantages, such as light weight, small size, low power consumption, and capability of bending and deformation, the flexible display screens are favored by users increasingly. However, the existing flexible display screens also have the following problems. Conducting wires are subjected to numerous bending during bending the flexible displays. When the strength of the conducting wires is insufficient, the conducting wires are prone to be damaged or the electrical connection of the conducting wires may be interrupted, thus affecting the work of the display screens.

SUMMARY

Embodiments of the present disclosure provide a flexible display screen and a flexible device, which have high stability in performance.

The present disclosure relates to a flexible display screen including a bending area. The bending area includes at least one wiring layer. The at least one wiring layer includes a plurality of conducting wires arranged at intervals. Each of the plurality of conducting wires includes at least two current paths configured to transmit an identical current signal.

The present disclosure relates to a flexible device including a flexible display screen.

In the embodiment, at least two current paths are arranged within a wiring layer of a flexible display screen, thus effectively avoiding the failure of conducting wires due to the large tensile stress on the conducting wires when the flexible display screen is bent, and thereby reducing a probability that the conducting wires of the flexible display screen are failure or the electrical connection of the conducting wires is interrupted. Therefore, the stability of the flexible display can be significantly improved, and the service life of the flexible display can be improved.

BRIEF DESCRIPTION OF THE DRAWINGS

In order to more clearly illustrate the technical solution of the present disclosure, the accompanying drawings required for describing the embodiments will be briefly described below. Apparently, the accompanying drawings in the following description are merely the embodiments of the present disclosure, and other drawings may be obtained by those skilled in the art according to these accompanying drawings without paying any creative labor.

DETAILED DESCRIPTION

The technical solutions in the embodiments of the present disclosure are clearly and completely described below with reference to the accompanying drawings in the embodiments of the present disclosure.

Embodiments of present disclosure provide a flexible display screen applied to a flexible device, such as a flexible terminal, a flexible tablet computer, or a wearable device with display function.

Figure 1:
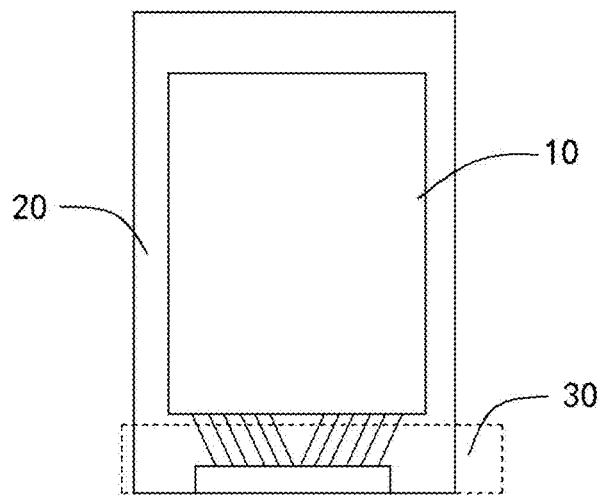
FIG. 1 is a schematic plan view of a flexible display screen provided by the present disclosure.
Figure 2:
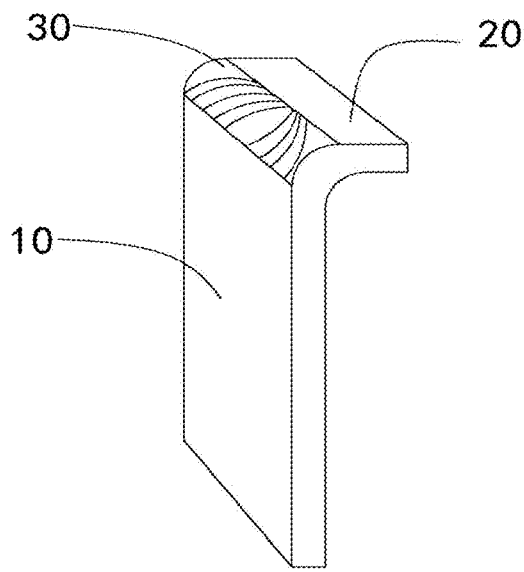
FIG. 2 is a schematic view of a state of the flexible display screen of FIG. 1 during bending process.

As illustrated in FIG. 1 and FIG. 2, a flexible display screen 100 includes a display area 10, a non-display area 20 located at a periphery of the display area 10, and a bending area 30 located in the non-display area 20 of the flexible display screen 100. The bending area 30 includes at least one wiring layer (not shown). The at least one wiring layer includes a plurality of conducting wires arranged at intervals. Each of the plurality of conducting wires includes at least two current paths. The at least two current paths are configured to transmit an identical current signal passing through corresponding conducting wire.

Specifically, the non-display area 20 is mainly configured to arrange various main lines, wiring layers, and arrange driving devices, such as IC, to drive a display area display. In addition, the non-display area 20 further includes a substrate, an insulating layer, and a passivation layer, which are sequentially stacked. The substrate is configured to carry and support components. The insulating layer is configured to be electrically isolated from the wiring layer. The passivation layer is formed on a surface of the wiring layer. The passivation layer can avoid damage to the wiring layer by external factors, such as water vapor and oxygen, and play a role in protecting the wiring layer. In the embodiment, data lines and scanning lines, etc. of the flexible display screen 100 converge in the non-display area 20, and are electrically connected with devices, such as IC, by the conducting wires of the wiring layer. It will be apprehended that a shape of the display area 10 and arrangement of the non-display area 20 are not limited to the exemplary flexible display screen 100 illustrated in FIG. 1. The shape of the display area 10 may be a polygon, a circle or an ellipse, etc. Details can be arranged according to the actual situations.

In the present disclosure, at least two current paths are arranged in the wiring layer of the flexible display screen 100, thus effectively avoiding the failure of a conducting wire due to the large tensile stress on the conducting wire when the flexible display screen is bent, and thereby reducing a probability that the conducting wire of the flexible display screen is failure or an electrical connection of the conducting wire is broken. Therefore, the stability of the flexible display can be significantly improved, and the service life of the flexible display can be improved. In the embodiment, the at least two current paths are determined by at least one through hole group arranged on the conducting wire, and details refer to the following embodiments.

Figure 3:
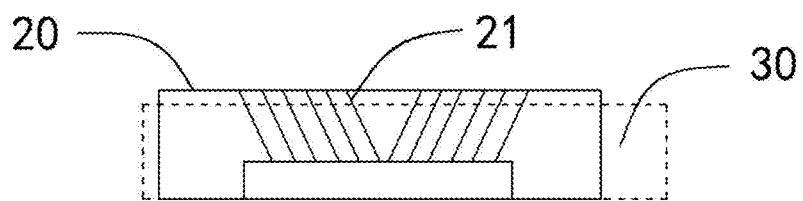
FIG. 3 is a schematic plan view of a partial structure of the flexible display screen of FIG. 1.
Figure 4:
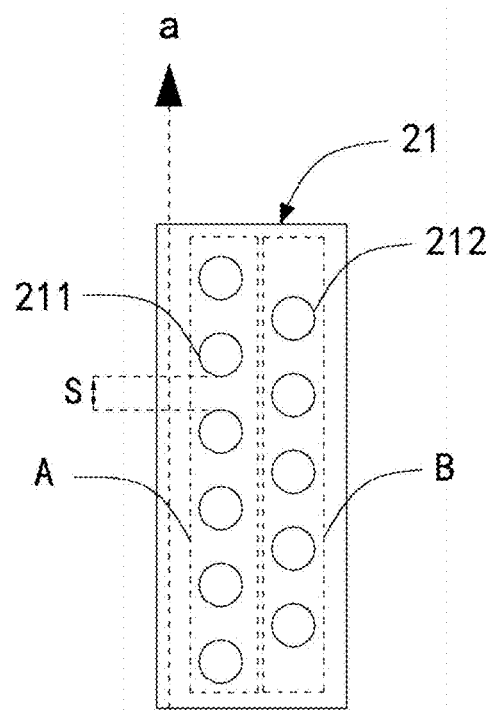
FIG. 4 is a schematic structural plan view of a conducting wire of the flexible display screen of FIG. 1 in a first embodiment.

As illustrated in FIG. 3 and FIG. 4, in the first embodiment of the present disclosure, the wiring layer has one layer. The wiring layer includes a plurality of conducting wires 21. Each of the plurality of conducting wires 21 includes at least one through hole group. The at least one through hole group includes a first through hole group A and a second through hole group B, which are arranged on each of the plurality of conducting wires 21 of the wiring layer at intervals and side by side. The first through hole group A includes a plurality of first through holes 211 arranged at intervals. The second through hole group B includes a plurality of second through holes 212 arranged at intervals. The current path is formed in an area outside of the plurality of first through holes 211 and the plurality of second through holes 212. The current path is formed in gaps, which include gaps between the plurality of first through holes 211, gaps between the plurality of second through holes 212, and a gap between the first through holes 211 and the second through holes 212. The plurality of first through holes 211 of the first through hole group A and the plurality of second through holes 212 of the second through hole group B are arranged along a direction parallel to an extending direction of the conducting wires 21. In a direction perpendicular to the extending direction of the conducting wires 21, each of the plurality of second through holes 212 is correspondingly arranged opposite to a gap between each two adjacent first through holes 211, and an orthographic projection of the second through hole 212 opposite to the gap on the first through hole group A covers the gap. In other embodiments, the first through holes 211 and the second through holes 212 may be arranged in a misaligned manner, or arranged in a one-to-one correspondence.

Specifically, a connecting wire part that bypasses the first through holes 211 may be taken as a current path. A connecting wire part that bypasses the second through holes 212 may also be taken as a current path. A connecting wire part that bypasses the first through holes 211 and the second through holes 212 may also be taken as a current path. It will be apprehended that a connecting wire part can be taken as a current path as long as an electric current can be flow into one end of each conducting wire 21 and flow out from the other end of each conducting wire 21.

Figure 5:
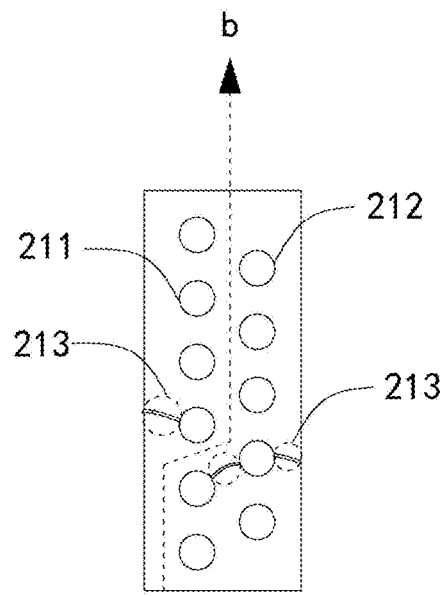
FIG. 5 is a schematic view of a direction of a current path after the conducting wire of FIG. 4 is broken.

As illustrated in FIG. 4, the first through hole 211 and the second through hole 212 are circular holes. The plurality of the first through holes 211 are arranged in a line at intervals, and each of the plurality of the second through holes 212 is opposite to the gap S between each two adjacent first through holes 211. The gap S illustrated in FIG. 4 is the shortest distance between two adjacent first through holes 211, and an orthographic projection of the second through hole 212 on the first through hole group A covers the gap S. As illustrated in FIG. 1 and FIG. 4, when the flexible display screen 100 is in an unbent state, an electric current is conducted along a current path (a) with the smallest resistance value. However, as illustrated in FIG. 1 and FIG. 5, when two sides of the conducting wire 21 are broken simultaneously to form a plurality of cracks 213 since the flexible display screen 100 is bent, the cracks 213 generally extend in a direction perpendicular to the extending direction of the conducting wire 21. However, since the plurality of first through holes 211 and/or the plurality of second through holes 212 exist, the cracks 213 may terminate at the plurality of first through holes 211 and/or the plurality of second through holes 212, thus preventing the current path from being broken because the conducting wire 21 is completely broken. When the conducting wire 21 is not completely broken, a wire area between the first through hole 211 and the second through hole 212 on the conducting wire 21, where an electric current passes through, forms a current path (b), thus making the current path on the conducting wire 21 to conduct continuously. Therefore, the first through hole 211 and the second through hole 212 arranged on the conducting wire 21 can not only reduce a stress of the conducting wire 21 when the conducting wire 21 is bent, but also prevent the entire conducting wire 21 from being broken when the conducting wire 21 has cracks 213. Therefore, the failure of the conducting wire 21 can be significantly reduced, and the service life of the conducting wire 21 can be prolonged. In other embodiments, shapes of the plurality of first through holes 211 and shapes of the plurality of second through holes 212 may include two or more of a circle, a polygon, and an ellipse. Details can be arranged according to the actual situations.

Figure 6:
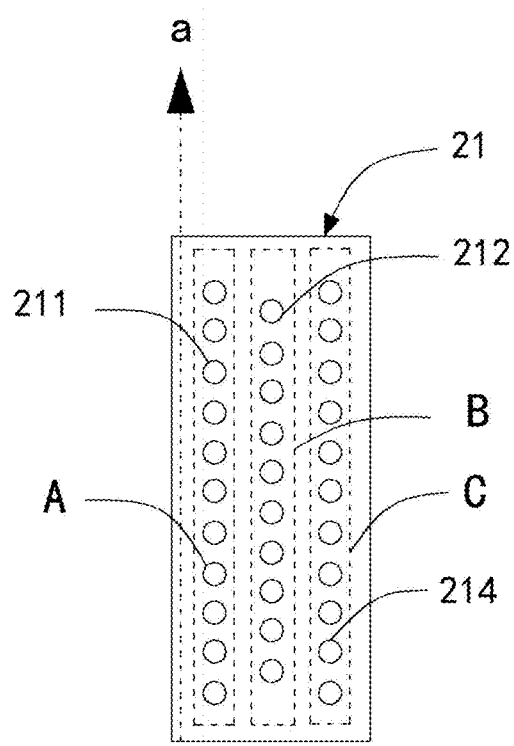
FIG. 6 is a schematic view of a third through hole group arranged on the conducting wire of FIG. 4.

Furthermore, as illustrated in FIG. 6, the conducting wire includes a third through hole group C. The third through hole group C and the second through hole group B are arranged at intervals and side by side. The third through hole group C includes a plurality of third through holes 214 arranged at intervals along a direction parallel to an extending direction of the conducting wires 21. Specifically, in a direction perpendicular to the extending direction of the conducting wires 21, each of the plurality of third through holes 214 is opposite to a gap between each two adjacent first through holes 211, or each of the plurality of third through holes is opposite to a gap between each two adjacent second through holes 212. A current path is formed in an area outside of the plurality of first through holes 211, the plurality of second through holes 212, and the plurality of third through holes 214. The current path is formed in gaps between the plurality of first through holes 211, between the plurality of second through holes 212, between the plurality of third through holes 214, between the first through hole 211 and the second through hole 212, and between the second through hole 212 and the third through hole 214. In the embodiment, the third through holes 214 are circular holes. Each of the plurality of third through holes 214 is opposite to a gap between each two adjacent second through holes 212, and an orthographic projection of the third through holes 214 on the second through hole group B covers the gap. It will be apprehended that the arrangement of the third through holes 214 is not limited to the exemplary position illustrated in FIG. 6. When a cross section is formed at any position on the conducting wire 21 along a direction perpendicular to the extending direction of the conducting wires 21, the cross section includes at least one of the first through hole 211, the second through hole 212, and the third through hole 214.

Figure 7:
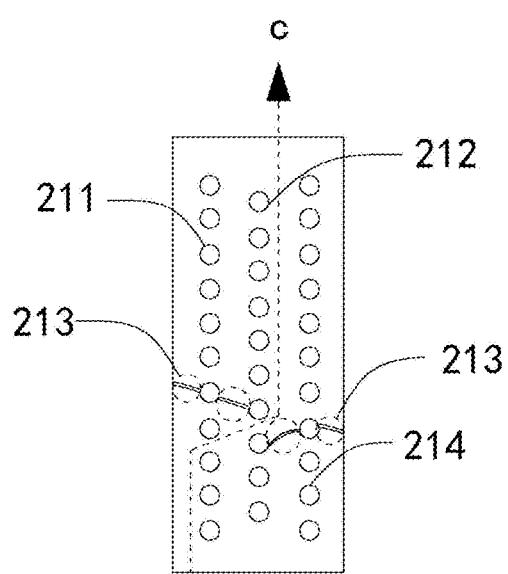
FIG. 7 is a schematic view of a direction of a current path after the conducting wire of FIG. 6 is broken.

As illustrated in FIG. 1 and FIG. 6, when the flexible display screen 100 is in an unbent state, an electric current is conducted along a current path (a) with the smallest resistance value. However, as illustrated in FIG. 1 and FIG. 7, when the flexible display screen 100 is bent, two sides of the conducting wire 21 are broken simultaneously to form a plurality of cracks 213, and the cracks 213 extend in a direction perpendicular to an extending direction of the conducting wire 21. Since the plurality of first through holes 211 and/or the plurality of second through holes 212 exist, the cracks 213 may terminate at the plurality of first through holes 211 and/or the plurality of second through holes 212. In addition, since a connecting wire part on a current path (a) has a crack 213, the current path (a) is broken. In this way, an electric current is conducted by a second current path at an unbroken part of the conducting wire 21. Furthermore, when a bending stress of the flexible display screen 100 is larger, the crack 213 that ends at the third through hole 214 continues to break along one side adjacent to the second through hole 212, and the crack 213 ends at the second through hole 212. In this way, the current path (b) is also broken. However, since the conducting wire 21 still has an unbroken part, an electric current is conducted by a current path c. Therefore, compared with each of the conducting wire 21 provided with the first through hole group A and the second through hole group B, each of the conducting wire 21 further provided with the third through hole group C, thus further increasing the number of the current paths. In addition, the conducting wire 21 arranges the third through hole 214, thus further preventing the entire conducting wire 21 from being broken when the conducting wire 21 has cracks 213, and thereby reducing a probability of the failure of the conducting wire 21 and prolonging the service life of the conducting wire 21. In other embodiments, the conducting wire 21 may further include a plurality of through hole groups, but in order to ensure an electrical connection of the conducting wire 21, a size of the through hole of each through hole group on the conducting wire 21 needs to be relatively reduced. Details can be arranged according to the actual situations.

Figure 8:
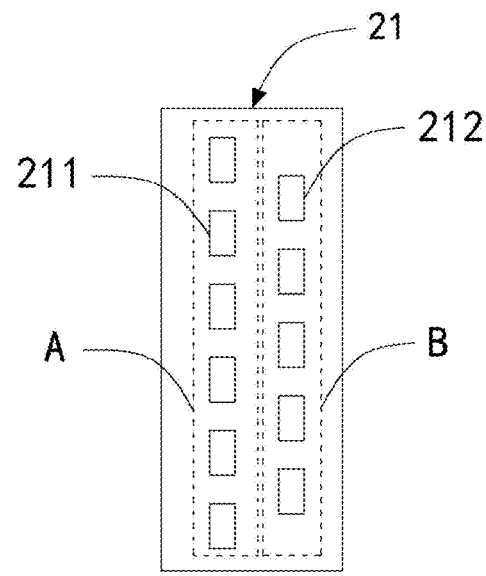
FIG. 8 is a schematic view of the conducting wire of the flexible display screen of FIG. 1 in a second embodiment, and the conducting wire of the second embodiment is different from the conducting wire of the first embodiment of FIG. 4 in that shapes of a first through hole group and a second through hole group.

As illustrated in FIG. 8, a second embodiment of the present disclosure is different from the first embodiment in that the first through hole 211 and the second through hole 212 are polygonal holes. In the embodiment, the first through hole 211 and the second through hole 212 are rectangular holes. The rectangular hole includes a long side parallel to an extending direction of the conducting wire 21 and a short side perpendicular to the extending direction of the conducting wire 21. In this way, by reducing a lengthwise of the short side of the rectangular hole, not only the probability of the failure of the conducting wire 21 can be reduced and the service life of the conducting wire 21 can be prolonged, but also the firmness of the conducting wire 21 can be ensured. Furthermore, a third through hole group including a plurality of polygonal holes is arranged on the conducting wire 21, and the third through hole group includes a plurality of third through holes arranged along a direction parallel to the extending direction of the conducting wire 21. In this way, the probability of the failure of the conducting wire 21 can be further reduced, and the service life of the conducting wire 21 can be prolonged.

Figure 9:
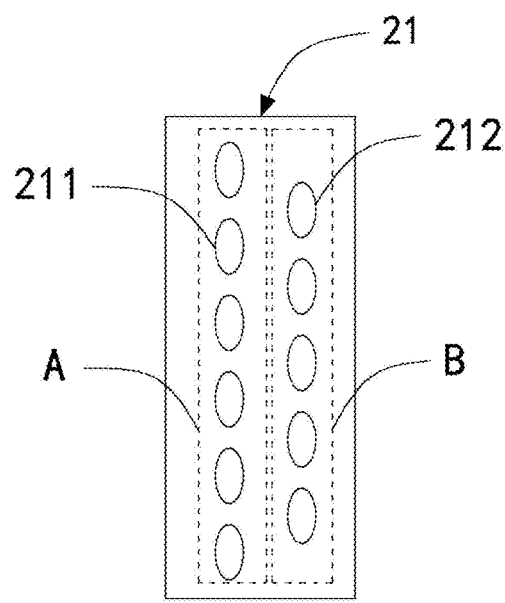
FIG. 9 is a schematic view of the conducting wire of the flexible display screen of FIG. 1 in a third embodiment, and the conducting wire of the third embodiment is different from the conducting wire of the first embodiment of FIG. 4 in that shapes of a first through hole group and a second through hole group.

As illustrated in FIG. 1 and FIG. 9, a third embodiment of the present disclosure is different from the first embodiment in that the first through hole 211 and the second through hole 212 are elliptical holes. The elliptical hole has a long axis parallel to the extending direction of the conducting wire 21 and a short axis perpendicular to the extending direction of the conducting wire 21. By increasing a lengthwise of the long axis and reducing a lengthwise of the short axis, not only the probability of the failure of the conducting wire 21 can be reduced and the service life of the conducting wire 21 can be prolonged, but also the firmness of the conducting wire 21 can be ensured. In addition, since an edge of the elliptical hole is in a curved shape, a certain angle is formed between the edge of the elliptical hole of the conducting wire 21 and a bending direction of the flexible display screen 100. Therefore, the edge of the elliptical hole of the conducting wire 21 can significantly reduce a stress on the conducting wire 21 and avoid the failure of the conducting wire 21. Furthermore, a third through hole group including a plurality of elliptical holes is arranged on the conducting wire 21, thus further reducing the probability of the failure of the conducting wire 21, and thereby prolonging the service life of the conducting wire 21.

Figure 10:
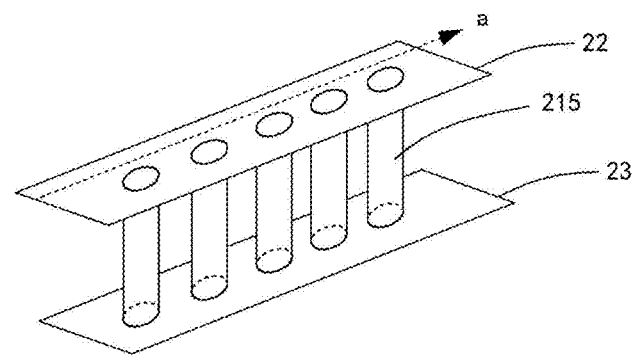
FIG. 10 is a schematic view of the conducting wire of the flexible display screen of FIG. 1 in a fourth embodiment.

As illustrated in FIG. 1 and FIG. 10, FIG. 10 is a schematic view of the conducting wire, which is provided by a fourth embodiment, of the flexible display screen of FIG. 1. A fourth embodiment of the present disclosure is different from the first embodiment in that the wiring layer includes a first wiring layer (not shown) and a second wiring layer (not shown), which are stacked and electrically isolated from each other. In the embodiment, the first wiring layer and the second wiring layer are electrode layers, which include electrode wires. The first wiring layer includes a plurality of first conducting wires 22 arranged at intervals. The second wiring layer includes a plurality of second conducting wires 23 arranged at intervals. The plurality of first conducting wires 22 are connected in a one-to-one correspondence with the plurality of second conducting wires. A specific connection between the first conducting wire 22 and the second conducting wire 23 can be established using a convergent end formed on an end of the display area 20. A plurality of conductive connection bodies 215 arranged at intervals, which are connected between each of the plurality of first conducting wires 22 and each of the plurality of second conducting wires 23, to form a plurality of current paths. The plurality of first conducting wires 22 and the plurality of second conducting wires 23 may be electrode wires, or may include other signal wires. In addition, the plurality of current paths on the first conducting wire 22, the second conducting wire 23 and the conductive connection bodies 215 are configured to transfer a current signal to the convergent end. For example, the first conducting wire 22 and the conductive connection body 215 add the second conducting wire 23 may also be taken as a current path. In addition, the first conducting wire 22 and any plurality of conductive connection bodies 215 add the second conducting wire 23 may also be taken as a current path. A dielectric layer is arranged between the first wiring layer and the second wiring layer. The plurality of conductive connection bodies 215 are arranged at the dielectric layer and connected with the first conducting wire 22 and the second conducting wire 23. The first conducting wire 22 and the second conducting wire 23 are arranged parallel to and facing each other. In the embodiment, an orthographic projection of the first conducting wire 22 on the second conducting wire 23 overlaps the second conducting wire 23 completely.

Figure 11:
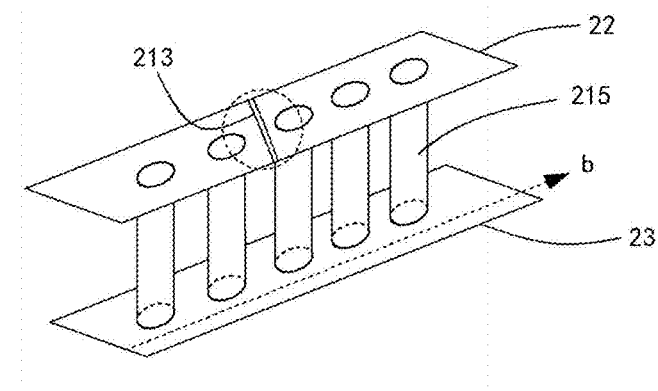
FIG. 11 and FIG. 12 are schematic views of current paths after the conducting wire of FIG. 10 is broken.

As illustrated in FIG. 1 and FIG. 10, when the flexible display screen 100 is in an unbent state, an electric current is conducted along a current path (a) with the smallest resistance value. In the first case, as illustrated in FIG. 11, the current path (a) is formed on the first conducting wire 22. When the flexible screen 23 is bent to break the first conducting wire 22, the current path (a) on the first conducting wire 22 is broken. In this way, since the second conducting wire 23 does not generate a crack 213, which is taken as a current path, the electric current can be conducted by the second conducting wire 23. Alternatively, the current path (a) is formed on the second conducting wire 23, and when the flexible display screen 100 is bent to break the second conducting wire 23, the current path (a) on the second conducting wire 23 is broken. In this way, the electric current can be conducted by the first conducting wire 22. The wiring layer is provided with the first wiring layer and the second wiring layer, thus increasing the number of the current paths, avoiding that when the first conducting wire 22 or the second conducting wire 23 has a crack 213, it will not cause the display screen 100 to fail because only one wire breaks, and thereby effectively reducing the probability of the failure of the conducting wire and prolonging the service life of the conducting wire. In addition, compared with one conducting wire, the first conducting wire 22 and the second conducting wire 23 can increase the conducting wire resistance to bending stress.

Figure 12:
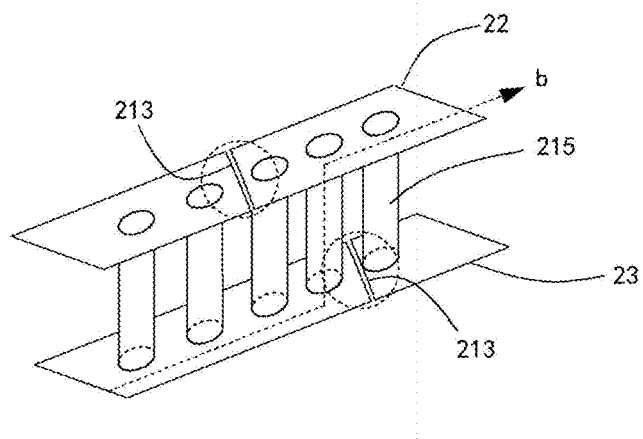

In the second case, as illustrated in FIG. 12, the first conducting wire 22 and the second conducting wire 23 are broken simultaneously, and cracks 213 are located between the different conductive connection bodies 215. The cracks 213 extend along a direction perpendicular to the extending direction of the conducting wires, and the first conducting wire 22 and the second conducting wire 23 are broken by cracks 213. At this time, both of the first conducting wire 22 and the second conducting wire 23 are broken, that is, no matter whether the current path (a) located at the first conducting wire 22 or the second conducting wire 23 will be broken. However, since the conductive connection body 215 is arranged between the first wiring layer and the second wiring layer, the electric current can be curvedly conducted by the first conducting wire 22, the second conducting wire 23 and the conductive connection body 215. That is, a current path (b) is formed. It will be apprehended that a curve conduction mode is not limited to the exemplary current path (b) of FIG. 12. Therefore, the wiring layer is provided with the first wiring layer and the second wiring layer, and the plurality of conductive connection bodies 215 are arranged between the first wiring layer and the second wiring layer, thus greatly increasing the number of the current paths, significantly reducing the probability of the failure of the plurality of first conducting wires 22, and thereby prolonging the service life of the flexible display screen 100.

Figure 13:
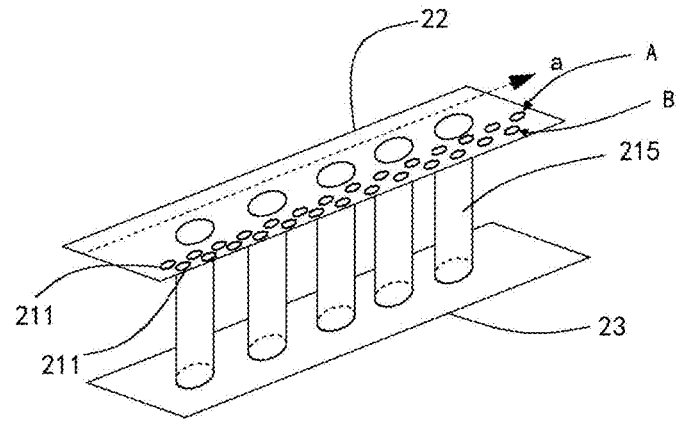
FIG. 13 is a schematic view of a connection between a first through hole group and a second through hole group of the conducting wire of FIG. 10.

Furthermore, as illustrated in FIG. 13, a first through hole group A and a second through hole group B, which are arranged side by side and at intervals, are arranged on the plurality of first conducting wires 22 and/or the plurality of second conducting wires 23. The first through hole group A includes a plurality of first through holes 211 arranged at intervals. The second through hole group B includes a plurality of second through holes 212 arranged at intervals. The plurality of first through holes 211 and the plurality of second through holes 212 are arranged along a direction parallel to an extending direction of the first conducting wires 22. In a direction perpendicular to the extending direction of the first conducting wires 22, each of the plurality of second through holes 212 is correspondingly arranged opposite to a gap between each two adjacent first through holes 211, and an orthographic projection of the second through hole 212 opposite to the gap on the first through hole group A covers the gap.

In the embodiment, both of the first through hole 211 and the second through hole 212 are circular holes. The plurality of first through holes 211 are arranged in a line at intervals. Each of the plurality of second through holes 212 is opposite to the gap between each two first through holes 211, and the orthographic projection of the second through hole 212 on the first through hole group A covers the gap. It will be apprehended that the arrangement of the plurality of first through holes 211 is not limited to the exemplary first conducting wire 22 and the exemplary second conducting wire 23 of FIG. 13. In other embodiments, shapes of the plurality of first through holes 211 and the plurality of second through holes 212 may include two or more of a circle, a polygon, and an ellipse. Details can be arranged according to the actual situations.

Figure 14:
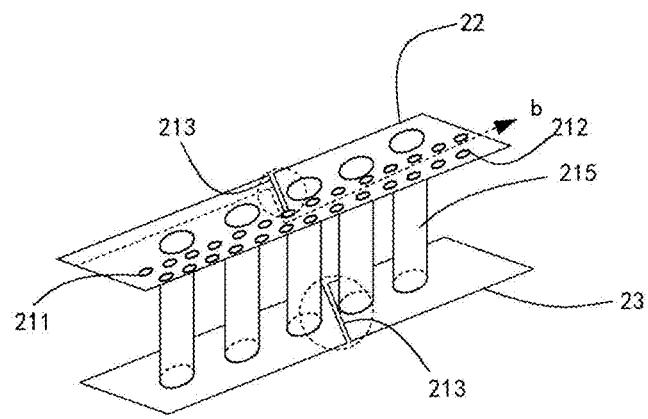
FIG. 14 is a schematic view of a current path after the conducting wire of FIG. 13 is broken.

As illustrated in FIG. 1 and FIG. 13, when the flexible display screen 100 is in an unbent state, an electrical current is conducted by a current path (a). As illustrated in FIG. 14, when the flexible display screen 100 is bent to make the first conducting wire 22 and the second conducting wire 23 to break simultaneously, cracks 213 may be located between the different conductive connection bodies 215. Specifically, the second conducting wire 23 is completely divided into two parts by the crack 213. Since the first conducting wire 22 has the first through hole group A and the second through hole group B, when an edge of the first conducting wire 22 breaks, cracks 213 extends along a direction perpendicular to the extending direction of the first conducting wires 22 the break 213 and ends at the plurality of first through holes 211 and/or the plurality of second through holes 212. At this time, the current path (a) is broken. Since the first conducting wire 22 is not completely broken, the electrical current is conducted by the current path (b). Since the first through hole group A and the second through hole group B are arranged on the first conducting wire 22, each of the plurality of first conducting wires 22 can further provided more current paths for transmitting an identical current signal. Therefore, the first through holes 211 and the second through holes 212 are arranged on the first conducting wire 22 can not only reduce the bending stress, but also prevent the entire first conducting wire 22 from being broken when the first conducting wire 22 has the crack 213. Therefore, the failure of the first conducting wire 22 can be significantly reduced, and the service life of the first conducting wire 22 can be prolonged. In other embodiments, the first through hole group A and the second through hole group B may also be arranged on the second conducting wire 23 or arranged on each of the plurality of first conducting wire 22 and the plurality of second conducting wires 23 simultaneously.

Furthermore, a third through hole group (not shown) arranged side by side with the second through hole group B is arranged on the plurality of first conducting wires 22 and the second conducting wires 23, the three through hole group includes a plurality of third through holes (not shown) arranged side by side along a direction parallel to the extending direction of the conducting wires. Specifically, in a direction perpendicular to the extending direction of the conducting wires 21, each of the plurality of third through holes is opposite to the gap S between each two adjacent first through holes 211, or opposite to the gap S between each two adjacent second through holes 212. The current path is formed in an area outside of the plurality of first through holes 211, the plurality of second through holes 212, and the plurality of third through holes. Specifically, compared with each of the first conducting wire 22 provided with the first through hole group A and the second through hole group B, each of the first conducting wire 22 further provided with the third through hole group, thus further increasing the number of the current paths. The third through hole group is arranged on the first conducting wire 22, thus preventing the entire first conducting wire 22 from being broken when the first conducting wire 22 has the crack 213. Therefore, the failure of the first conducting wire 22 can be significantly reduced, and the service life of the first conducting wire 22 can be prolonged. In other embodiments, the third through hole group may also be arranged on the second conducting wire 23 or arranged on each of the plurality of first conducting wire 22 and the plurality of second conducting wires 23 simultaneously.

Figure 15:
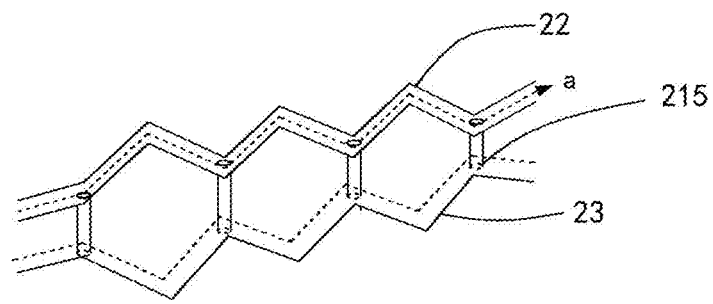
FIG. 15 is a schematic view of the conducting wire of the flexible display screen of FIG. 1 in a fifth embodiment.

As illustrated in FIG. 15, a fifth embodiment of the present disclosure is different from the fourth embodiment in that the first conducting wire 22 and the second conducting wire 23 extend in a curved shape along a lengthwise direction. The plurality of conductive connection bodies 215 are connected with a bending portion where the first conducting wire 22 meets the second conducting wire 23. As described in the fourth embodiment, since the conductive connection body 215 is arranged on the first and second wires 22 and 23, which are arranged in a curve, the number of the current paths can be greatly increased and the probability of the failure of the conducting wire can be significantly reduced. In addition, since the first conducting wire 22 and the second conducting wire 23 extend in a curve along a direction of the extending direction the conducting wire, a certain angle is formed between the first conducting wire 22 and a bending direction of the flexible display screen 100, and between the second conducting wire 23 and the bending direction, thus significantly reducing stresses on the first conducting wire 22 and the second conducting wire 23 and avoiding the failure of the first conducting wire 22 and the second conducting wire 23. In other embodiments, the first conducting wire 22 and the second conducting wire 23 extend in a wave shape along the lengthwise direction. A peak of the first conducting wire 22 is opposite to a trough of the second conducting wire 23, and a trough of the first conducting wire 22 is opposite to a peak of the second conducting wire 23. The conductive connection body 215 is connected to the trough of the first conducting wire 22 and the peak position of the second conducting wire 23. Therefore, the first conducting wire 22 and the second conducting wire 23, which are substantially in a wave shape, are provided with the conductive connection body 215, thus greatly increasing the number of the current paths, and thereby significantly reducing the probability of the failure of the conducting wire.

Figure 16:
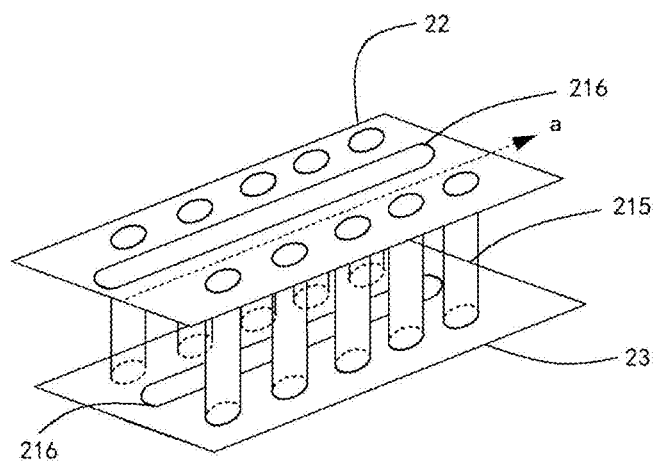
FIG. 16 is a schematic view of the conducting wire of the flexible display screen of FIG. 1 in a sixth embodiment.

As illustrated in FIG. 1 and FIG. 16, a sixth embodiment of the present disclosure is different from the fourth embodiment in that the first conducting wire 22 and the second conducting wire 23 define strip through holes 216. The strip through holes 216 extend along a direction parallel to an extending direction of the first conducting wires 22 and are arranged adjacent to the conductive connection body 215. Specifically, when the flexible display screen 100 is in an unbent state, the electrical current is conducted by the current path (a). However, when the flexible display screen 100 is bent to break the first conducting wire 22 and the second conducting wire 23 simultaneously, the first conducting wire 22 and the second conducting wire 23 generate cracks located between different conductive connection bodies 215. Specifically, since the first conducting wire 22 and the second conducting wire 23 define the strip through holes 216, the cracks of the first conducting wire 22 and the second conducting wire 23 end at the strip through holes 216, and the current path (a) is broken. Since the first conducting wire 22 and the second conducting wire 23 are not completely broken, an electric current is conducted by a second current path at an unbroken part of the first conducting wire 22. The strip through holes 216 are arranged on the first conducting wire 22 and the second conducting wire 23, thus preventing the entire first conducting wire 22 and the second conducting wire 23 from breaking when the first conducting wire 22 and the second conducting wire 23 are broken, effectively reducing the probability of the failure of the first conducting wire 22 and the second conducting wire 23, and thereby extending the service life of the first conducting wire 22 and the second conducting wire 23. In addition, compared with one conducting wire, the first conducting wire 22 and the second conducting wire 23 can increase the conducting wire resistance to bending stress.

The present disclosure provides a flexible device including the flexible display screen 100. The flexible device may be a touch screen, a touch terminal, an in-vehicle device, a network TV, a wearable device, and the like.

The above is only the preferable embodiment of the present disclosure, the scope of the present disclosure is not limited to thereof. It will be understood by those of ordinary skill in the art that all or a part of the process of the method of the above embodiments described above, and equivalent changes made in the claims of the present disclosure are still within the scope of the present disclosure.

What is claimed is:

1. A flexible display screen, comprising a bending area, wherein the bending area comprises at least one wiring layer; the at least one wiring layer comprises a plurality of conducting wires arranged at intervals; each of the plurality of conducting wires comprises at least two current paths; the at least two current paths are configured to transmit an identical current signal passing through corresponding conducting wire, wherein each of the plurality of conducting wires comprises at least one through hole group; the at least one through hole group comprises a first through hole group and a second through hole group, which are arranged on corresponding conducting wire at intervals and side by side; the first through hole group comprises a plurality of first through holes arranged at intervals; the second through hole group comprises a plurality of second through holes arranged at intervals; the current path is formed in an area outside of the plurality of first through holes and the plurality of second through holes.

2. The flexible display screen of claim 1, wherein the plurality of first through holes and the plurality of second through holes are arranged along a direction parallel to an extending direction of the conducting wires; in a direction perpendicular to the extending direction of the conducting wires, each of the plurality of second through holes is correspondingly arranged opposite to a gap between each two adjacent first through holes; an orthographic projection of each of the plurality of second through holes in a direction perpendicular to the extending direction of the conducting wires covers the gap.

3. The flexible display screen of claim 2, wherein the at least one through hole group further comprises a third through hole group arranged on corresponding conducting wire and arranged at intervals and side by side with the second through hole group; the third through hole group comprises a plurality of third through holes arranged at intervals along a direction parallel to the extending direction of the corresponding conducting wire.

4. The flexible display screen of claim 2, wherein each of the plurality of first through holes, the plurality of second through holes, or the plurality of third through holes of the at least one through hole group has a shape comprising one, two or more of a circle, an ellipse, a triangle, and a polygon.

5. The flexible display screen of claim 1, wherein the at least one wiring layer comprises a first wiring layer and a second wiring layer, which are stacked and electrically isolated from each other; the first wiring layer comprises a plurality of first conducting wires arranged at intervals; the second wiring layer comprises a plurality of second conducting wires arranged at intervals; the plurality of first conducting wires are connected in a one-to-one correspondence with the plurality of second conducting wires; a plurality of conductive connection bodies arranged at intervals are arranged between each of the plurality of first conducting wires and each of the plurality of second conducting wires; each of the plurality of first conducting wires and each of the plurality of second conducting wires are connected by the plurality of conductive connection bodies to form a plurality of the current paths.

6. The flexible display screen of claim 5, wherein the plurality of first conducting wires and the plurality of second conducting wires extend in a curve shape along a lengthwise direction; the plurality of conductive connection bodies are connected with a bending portion where each of the plurality of first conducting wires meets each of the plurality of second conducting wires.

7. The flexible display screen of claim 5, wherein each of the plurality of first conducting wires and each of the plurality of second conducting wires define strip through holes; the strip through holes extend along an extending direction of the first conducting wires and are adjacent to the plurality of conductive connection bodies.

8. The flexible display screen of claim 5, wherein a first through hole group and a second through hole group arranged at intervals and side by side are arranged on the plurality of first conducting wires and/or the plurality of second conducting wires; the first through hole group comprises a plurality of first through holes arranged at intervals; the second through hole group comprises a plurality of second through holes arranged at intervals; the plurality of first through holes and the plurality of second through holes are arranged along a direction parallel to the extending direction of the first conducting wires; in a direction perpendicular to the extending direction of the first conducting wires, each of the plurality of second through holes is correspondingly arranged opposite to a gap between each two adjacent first through holes; an orthographic projection of each of the plurality of second through holes opposite to the gap on the second through hole group covers the gap.

9. The flexible display screen of claim 8, wherein a dielectric layer is arranged between the first wiring layer and the second wiring layer; the plurality of conductive connection bodies are arranged within the dielectric layer and connected with the plurality of first conducting wires and the plurality of second conducting wires.

10. The flexible display screen of claim 5, wherein the first wiring layer and the second wiring layer are electrode layers.

11. A flexible device, comprising a flexible display screen, wherein the flexible display screen comprises a bending area, wherein the bending area comprises at least one wiring layer; the at least one wiring layer comprises a plurality of conducting wires arranged at intervals; each of the plurality of conducting wires comprises at least two current paths; the at least two current paths are configured to transmit an identical current signal passing through corresponding conducting wire, wherein each of the plurality of conducting wires comprises at least one through hole group; the at least one through hole group comprises a first through hole group and a second through hole group, which are arranged on corresponding conducting wire at intervals and side by side; the first through hole group comprises a plurality of first through holes arranged at intervals; the second through hole group comprises a plurality of second through holes arranged at intervals; the current path is formed in an area outside of the plurality of first through holes and the plurality of second through holes.

12. The flexible device of claim 11, wherein the plurality of first through holes and the plurality of second through holes are arranged along a direction parallel to an extending direction of the conducting wires; in a direction perpendicular to the extending direction of the conducting wires, each of the plurality of second through holes is correspondingly arranged opposite to a gap between each two adjacent first through holes; an orthographic projection of each of the plurality of second through holes in a direction perpendicular to the extending direction of the conducting wires covers the gap.

13. The flexible device of claim 12, wherein the at least one through hole group further comprises a third through hole group arranged on corresponding conducting wire and arranged at intervals and side by side with the second through hole group; the third through hole group comprises a plurality of third through holes arranged at intervals along a direction parallel to the extending direction of the conducting wires.

14. The flexible device of claim 12, wherein each of the plurality of first through holes, the plurality of second through holes, or the plurality of third through holes of the plurality of through hole groups has a shape comprising one, two or more of a circle, an ellipse, a triangle, and a polygon.

15. The flexible device of claim 11, wherein the at least one wiring layer comprises a first wiring layer and a second wiring layer, which are stacked and electrically isolated from each other; the first wiring layer comprises a plurality of first conducting wires arranged at intervals; the second wiring layer comprises a plurality of second conducting wires arranged at intervals; the plurality of first conducting wires are connected in a one-to-one correspondence with the plurality of second conducting wires; a plurality of conductive connection bodies arranged at intervals are arranged between each of the plurality of first conducting wires and each of the plurality of second conducting wires; each of the plurality of first conducting wires and each of the plurality of second conducting wires are connected by the plurality of conductive connection bodies to form a plurality of the current paths.

16. The flexible device of claim 15, wherein the plurality of first conducting wires and the plurality of second conducting wires extend in a curve shape along a lengthwise direction; the plurality of conductive connection bodies are connected with a bending portion where each of the plurality of first conducting wires meets each of the plurality of second conducting wires.

17. The flexible device of claim 15, wherein each of the plurality of first conducting wires and each of the plurality of second conducting wires define strip through holes; the strip through holes extend along an extending direction of the first conducting wires and are adjacent to the plurality of conductive connection bodies.

18. The flexible device of claim 15, wherein a first through hole group and a second through hole group arranged at intervals and side by side are arranged on the plurality of first conducting wires and/or the plurality of second conducting wires; the first through hole group comprises a plurality of first through holes arranged at intervals; the second through hole group comprises a plurality of second through holes arranged at intervals; the plurality of first through holes and the plurality of second through holes are arranged along a direction parallel to the extending direction of the first conducting wires; in a direction perpendicular to the extending direction of the first conducting wires, each of the plurality of second through holes is correspondingly arranged opposite to a gap between each two adjacent first through holes; an orthographic projection of each of the plurality of second through holes opposite to the gap on the second through hole group covers the gap.

* * * * *